(12) United States Patent
Trudnak et al.

(10) Patent No.: US 11,113,933 B1
(45) Date of Patent: Sep. 7, 2021

(54) VISUAL INDICATION SYSTEM FOR FEEDBACK CONTROLLER

(71) Applicants: Robert Trudnak, Lansdale, PA (US); Eric Fulmer, Collegeville, PA (US)

(72) Inventors: Robert Trudnak, Lansdale, PA (US); Eric Fulmer, Collegeville, PA (US)

(73) Assignee: Therm-Omega-Tech, Inc., Warminster, PA (US)

( * ) Notice: Subject to any disclaimer, the term of this patent is extended or adjusted under 35 U.S.C. 154(b) by 27 days.

(21) Appl. No.: 16/804,340

(22) Filed: Feb. 28, 2020

(51) Int. Cl.
*G08B 5/36* (2006.01)
*H05K 1/18* (2006.01)
*G08B 21/18* (2006.01)
*H05K 5/00* (2006.01)

(52) U.S. Cl.
CPC ............ *G08B 5/36* (2013.01); *G08B 21/182* (2013.01); *H05K 1/181* (2013.01); *H05K 5/0017* (2013.01); *H05K 2201/10106* (2013.01)

(58) Field of Classification Search
None
See application file for complete search history.

(56) References Cited

U.S. PATENT DOCUMENTS

| | | | | |
|---|---|---|---|---|
| 3,259,056 A | * | 7/1966 | King | G04C 23/14 99/325 |
| 4,183,203 A | * | 1/1980 | Maezawa | G04B 19/22 368/21 |
| 4,209,973 A | * | 7/1980 | Maezawa | G04B 19/22 368/232 |
| 6,064,372 A | * | 5/2000 | Kahkoska | G06F 1/1601 345/173 |
| 6,466,517 B1 | * | 10/2002 | Kohl | G04G 9/0082 368/21 |
| 6,727,814 B2 | * | 4/2004 | Saltzstein | G08B 1/08 340/531 |
| 7,128,432 B1 | * | 10/2006 | Stern | G02F 1/133615 362/97.3 |

(Continued)

FOREIGN PATENT DOCUMENTS

| | | | | |
|---|---|---|---|---|
| CN | 110858455 A | * | 3/2020 | G09B 5/06 |
| EP | 2933368 A1 | * | 10/2015 | D06F 33/00 |

(Continued)

*Primary Examiner* — Chico A Foxx
(74) *Attorney, Agent, or Firm* — Cusick IP, PLLC; Clinton J. Cusick, Esq.

(57) ABSTRACT

A device for communicating a system status visually is disclosed. The device comprises a primary indicator and a secondary indicator, and in an embodiment comprises a surround indicator and a tail indicator. Both indicators allow light to pass through a translucent portion to be visible by a user, and the device utilizes illumination elements such as multicolor LEDs to present the indicators in colors to communicate system status or a data category to inform a user about the system with simplified color signals easily perceived at a distance. The device can be configured to accept multiple sensor or signal inputs and control one or more powered devices to effect feedback control of a system variable, e.g. temperature. The tail indicator can change colors to communicate a data category provided by a signal input. The surround indicator can change colors to communicate a system status.

21 Claims, 7 Drawing Sheets

(56) References Cited

U.S. PATENT DOCUMENTS

| | | | | |
|---|---|---|---|---|
| 8,383,989 B2* | 2/2013 | Tominaga | ............... | H05B 6/062 219/220 |
| 9,962,029 B2* | 5/2018 | Baraille | ................ | A47J 36/321 |
| 2002/0083520 A1* | 7/2002 | Osborne-Kirby | ..... | E03C 1/0404 4/678 |
| 2005/0087191 A1* | 4/2005 | Morton | ............. | A61M 15/0065 128/205.23 |
| 2005/0135198 A1* | 6/2005 | Wellen | ................... | G04B 25/02 368/230 |
| 2005/0224322 A1* | 10/2005 | Kikuya | ................. | H01H 25/06 200/11 R |
| 2007/0200791 A1* | 8/2007 | Meyers | ................ | G06F 3/1446 345/1.1 |
| 2008/0297591 A1* | 12/2008 | Aarts | ....................... | H04N 5/74 348/51 |
| 2009/0261088 A1* | 10/2009 | Isoda | ...................... | F24C 7/082 219/489 |
| 2010/0045912 A1* | 2/2010 | Chen | ................... | G02F 1/13394 349/122 |
| 2010/0053475 A1* | 3/2010 | Han | .................... | H04N 9/3141 348/744 |
| 2010/0197280 A1* | 8/2010 | Hans | ................... | H04M 19/048 455/412.2 |
| 2011/0095874 A1* | 4/2011 | Bennett | ................ | G10H 1/0008 340/326 |
| 2011/0122082 A1* | 5/2011 | Orellana | .............. | H03K 17/962 345/173 |
| 2012/0206266 A1* | 8/2012 | Moons | ................... | G08B 17/06 340/584 |
| 2013/0226486 A1* | 8/2013 | Henderson | ................ | H02J 7/00 702/63 |
| 2013/0249698 A1* | 9/2013 | Fissler | ................ | A47J 27/0802 340/626 |
| 2014/0184418 A1* | 7/2014 | Maeda | ..................... | F24F 11/30 340/691.6 |
| 2015/0094951 A1* | 4/2015 | Gepner | ............. | G01C 21/3632 701/467 |
| 2015/0160850 A1* | 6/2015 | Krause | .................... | G06F 3/016 345/174 |
| 2015/0169011 A1* | 6/2015 | Bibl | ...................... | H01L 23/3171 345/175 |
| 2016/0037955 A1* | 2/2016 | Kim | ........................ | A47J 27/04 99/344 |
| 2016/0332729 A1* | 11/2016 | Woicekowski | ...... | B64D 11/003 |
| 2016/0379027 A1* | 12/2016 | Bruni | ................... | G06K 7/1096 235/462.41 |
| 2017/0004127 A1* | 1/2017 | Hong | .................. | G06F 3/04842 |
| 2017/0231052 A1* | 8/2017 | Li | ............................. | H04N 5/66 |
| 2018/0128493 A1* | 5/2018 | Chen | ..................... | H05B 3/746 |
| 2018/0152998 A1* | 5/2018 | Rollet | .................. | H05B 6/6438 |
| 2019/0170364 A1* | 6/2019 | Ha | .......................... | G05G 5/05 |
| 2019/0243058 A1* | 8/2019 | Kikuchi | ................. | G02F 1/133 |
| 2019/0279634 A1* | 9/2019 | Tak | ........................ | H04M 1/271 |
| 2019/0324409 A1* | 10/2019 | Chen | ....................... | G09G 3/12 |
| 2019/0345767 A1* | 11/2019 | Heinbuch | ................ | E06C 1/06 |
| 2021/0106175 A1* | 4/2021 | Carbone | ............... | A47J 36/321 |

FOREIGN PATENT DOCUMENTS

| | | | | |
|---|---|---|---|---|
| FR | 2706023 A1 * | 12/1994 | ............ | F27D 19/00 |
| WO | WO-2007043838 A1 * | 4/2007 | ............ | D06F 34/28 |
| WO | WO-2015015174 A1 * | 2/2015 | ............... | G08B 3/10 |

* cited by examiner

VISUAL INDICATION SYSTEM FOR FEEDBACK CONTROLLER

BACKGROUND OF THE INVENTION

Field of the Invention

The present general inventive concept is directed to a method and apparatus for communicating information about the operation and status of a controller to a user by visual indicators or electronic transmission.

Description of the Related Art

The current temperature controllers for outdoor cookers typically communicate the cooker temperature, food temperature, or target temperature by way of a numerical display on the controller apparatus. Often, the user is near the smoker or cooker but may be too far to accurately read the data displayed on the controller screen. Additionally, temperature controllers can communicate over wireless networks, cellular networks, or near field communication to display status or data on a computer, tablet, or mobile device. If a user is manipulating food or applying seasoning such as barbecue sauce, it may not be convenient to also grasp or retrieve a mobile device such as a phone. Visual acuity at a distance is required to read numerical or textual information, and the screen size of a portable device is not compatible with viewing at long distances. Different approaches are available including increasing the screen size or utilizing a mobile device to enable viewing that is remote from the temperature controller but close to the user.

Often, the status condition of a device is more important than the exact data. For example, where a temperature set point of 250 degrees F. is to be maintained by a controller, the user does not require detailed ongoing update or status information about the set point because it does not change. Further, details about the actual temperature being maintained are not as important as the status condition of the system. For example, information about status condition, knowing that the system is at temperature, below temperature, or above temperature, is the information that the user desires to know. The exact temperature, be it 270 or 271, is not as important as the communication that the system requires modification or user intervention. Similarly, communicating a specific detail of a system temperature of 250 or 252 is not nearly as important as communicating the system status as being satisfactory, or near the set point.

Prior art temperature controllers have centered on making a text or numerical displays more readable. U.S. Pat. No. 10,067,004 provides a temperature monitoring system where the display surface is angled relative to the surface on which it is mounted. The angle can be adjusted to increase readability. However, the usefulness of the numerical display is not increased at a distance. Further, the status of the feedback controller is not readily communicated visually, and temperatures are communicated by textual or numerical readout. Changing the angle of a display may increase readability by decreasing glare, however apprehension of system status at a distance is not increased.

What is needed is a device that can communicate a system status without the need for reading text at a distance. What is needed is a temperature controller that can operate a feedback control system as well as communicate the status of a system in a visual, intuitive manner. In an embodiment, the feedback control system can maintain the temperature of a cooker and communicate the status of a temperature controller operation, the cooker status condition, and display information about a data category for one or more food items in a visual, intuitive manner.

SUMMARY OF THE INVENTION

It is an aspect of the present invention to provide an improved communication device for informing a user about the status of a system including providing information on several system variables simultaneously. These aspects can be provided by a visual indicator device comprising a primary indicator provided by a surround lens at least partially surrounding a display and a secondary indicator provided by a translucent tail indicator adjacent said display; at least one illuminating element interior to the translucent tail and a plurality of illuminating elements interior to the surround lens; a light reflector positioned between the plurality of illuminating elements and the surround lens; and a housing retaining the primary indicator and secondary indicator as well as a circuit board for controlling the display, illuminating elements, and feedback control.

It is a further aspect of the invention to provide a communication device for informing a user about a system status via a surround indicator and a tail indicator oriented radial to the surround indicator. These aspects can be obtained by a communication device for informing a user comprising a housing with a surround indicator comprising a translucent surround lens and a tail indicator comprising a translucent tail lens wherein the surround indicator occupies a significant portion of a circumference of the housing and a tail indicator is oriented radial to the path of the surround indicator where a display for presenting numbers or text is positioned central to the surround indicator.

It is another aspect of the invention to provide a communication system for a temperature controller communication system comprising a visual indicator device, and can be provided by a visual indicator device for a feedback controller comprising a circuit board, a display, a surround indicator, a first sensor indicator, a second sensor indicator, a power output port, and a plurality of multicolor LEDs positioned exterior to a display light shield and interior to the surround indicator; wherein the surround indicator is illuminated in a first surround color to communicate a first system status and illuminated in a second surround color to communicate a second system status. The device can also comprise a tail indicator illuminated by at least one multicolor LED disposed within a tail light shield to provide a first tail color to indicate a first data category is presented by the display and a second tail color to indicate that a second data category is presented by the display. It is an object of the present invention to communicate an illuminated status condition, an illuminated data category, and a data display simultaneously.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

Further features and advantages of the present invention, as well as the structure and operation of various embodiments of the present invention, will become apparent and more readily appreciated from the following description of the preferred embodiments, taken in conjunction with the accompanying drawings of which.

DESCRIPTION OF THE PREFERRED EMBODIMENTS

Reference will now be made in detail to the presently preferred embodiments of the invention, examples of which are illustrated in the accompanying drawings, wherein like reference numerals refer to like elements throughout.

The present inventive concept relates to a method and apparatus for an illuminated visual indication system for use with a feedback controller. The current invention comprises a feedback controller that can utilize a power input and a power output to read data from probes or sensors to gather information on system variables. The feedback controller can calculate adjustments and inputs to the system through the power output to achieve a desired system status. The current invention also comprises a visual indicator device that can communicate information about a system status through the use of an illuminated primary indicator, for example, a surround indicator 20 and at least one additional visual indicator, for example a tail indicator 70. In one particular embodiment, the feedback controller can comprise a temperature feedback control system, for example as described in U.S. Pat. No. 7,516,692 entitled Method and Apparatus for Slow cooking, the disclosure of which is included herein in its entirety including pulse width modulation of a fan or impeller to control combustion in a cooker. The device and method of the invention can be utilized to measure other physical variables such as flow rate or pressure and provide feedback control as well as communicate system status of one or more measured variables to a user. In particular, the status of the measured variable when compared to a set point or target can be communicated in a highly visible manner. Temperature measurement and temperature control are particularly useful and will be discussed in detail herein. The visual indicator device can be adapted to numerous measured or controlled variables, for example pressure or flow rate, in the spirit of the invention.

As described herein, the terms "change colors" can comprise switching from a non-illuminated color to an illuminated color, or changing from a first illuminated color to a second illuminated color, or blinking. A blinking effect is conveyed by changing colors or hues of colors repeatedly. Thus, a non-illuminated indicator may appear black or grey or the color of the materials of construction. For example, a change from the base material color to the illuminated color comprises a color change. A change from a first illuminated color, e.g. red, to a second illuminated color, e.g. blue, comprises a color change.

Figure 1:
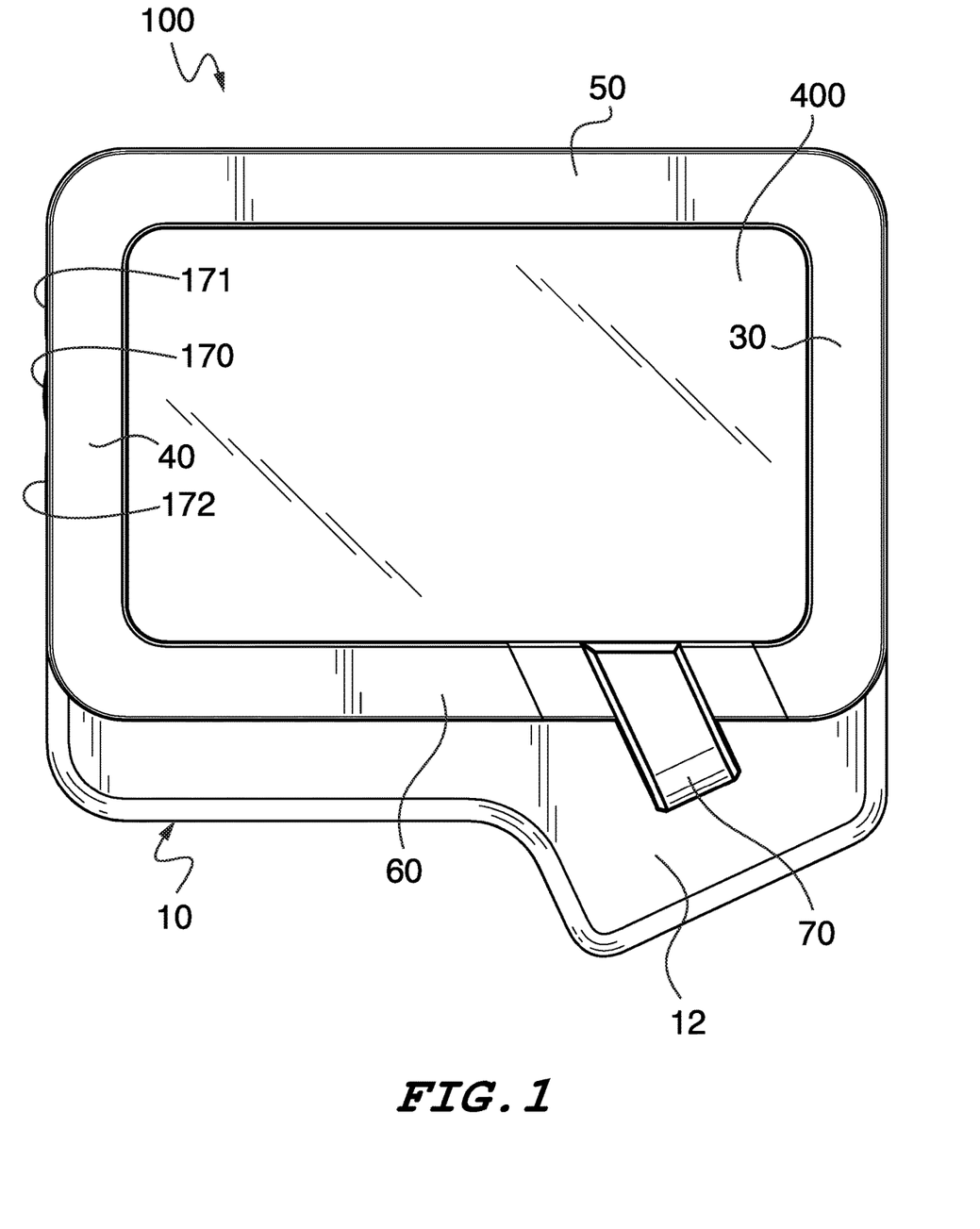
FIG. 1 is a front view of an indicator device in an embodiment of the invention.
Figure 3:
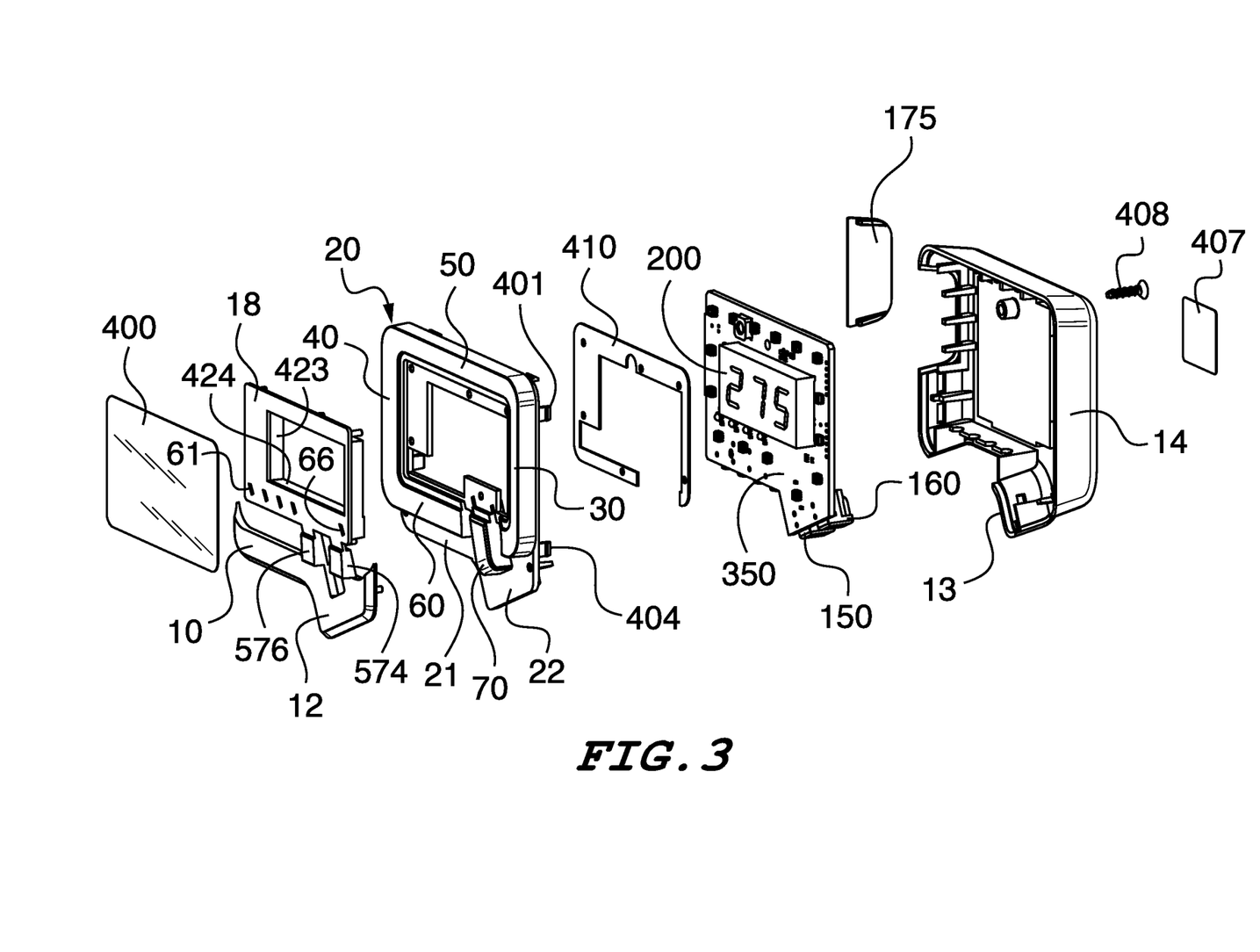
FIG. 3 is an exploded view of an indicator device in an embodiment of the invention.

FIG. 1 presents a front view of an indicator device 100 in an embodiment of the invention. Surround indicator 20 can form a continuous perimeter or circumference, or can form an incomplete perimeter as shown in FIGS. 1 and 3. Where surround indicator 20 is generally rectangular in shape, it can comprise surround lens first side 30 shown opposite surround lens second side 40 and surround lens top 50 shown opposite surround lens bottom 60. In an embodiment of the invention, surround indicator 20 comprises surround lens elements 30, 40, 50, and 60. Each of the lens portions of the surround indicator can be formed of clear plastic or polycarbonate or other clear or translucent material. For ease of assembly, surround indicator 20 can also comprise surround extension 21 and surround tail 22. Whereas the primary indicator is shown in this embodiment as surround indicator 20, in other embodiments, a primary indicator can be circular, rounded, or other desirable shape. Primary indicator is present on the front face of the device, in the Figures of an embodiment herein, but can also be positioned on the side, rear, or combinations of sides or surfaces such as appearing from the front and rear of the device within the spirit of the invention.

In an embodiment of the invention, the various sections of the surround indicator 20 can be illuminated or change colors independently to alternately communicate different information or system status. Tail indicator 70 can intersect the surround indicator or spacing can be provided between the surround indicator 20 and the tail indicator 70 by first tail spacer 574 and second tail spacer 576. Housing front 10 can be molded into a desired shape. Nylon with glass fill or comparable material can be employed to provide a long lasting and durable surface of housing front 10. Other plastics or molded plastics can be utilized and high melting point materials can be selected for use in or near hot environments. Tail housing front 12 can be provided as support for tail indicator 70 and to provide an aesthetic shape to the device, for example stylized as the outline of a letter Q. More generally tail indicator 70 can be referred to as a secondary indicator comprising a translucent tail that can be illuminated from the interior of the device to communicate a status condition or a data category to a user. Tail indicator 70 has an orientation generally radial to the lens 400. Alternately, tail indicator 70 can be oriented radial to the curved path of surround indicator 20. Display 200 is suited for displaying character data including text, numerals, or symbols. Lens 400 can be formed of clear plastic, for example matte clear Lexan, to allow light from display 200 to be visible and readable. When positioned inside surround indicator 20, the lens can be described as central lens 400. Connection indicator 260 can be illuminated when the indicator device 100 is wirelessly connected to an external device such as a phone or tablet or a computer network. The use of a primary indicator 20 and a secondary indicator 70 can be positioned on the sides and other surfaces of the device. The embodiment shown here presents the surround indicator 20 and the tail indicator 70 on the front of the device for ease of viewing when mounted to a surface or support via the rear of the device 100.

Figure 2:
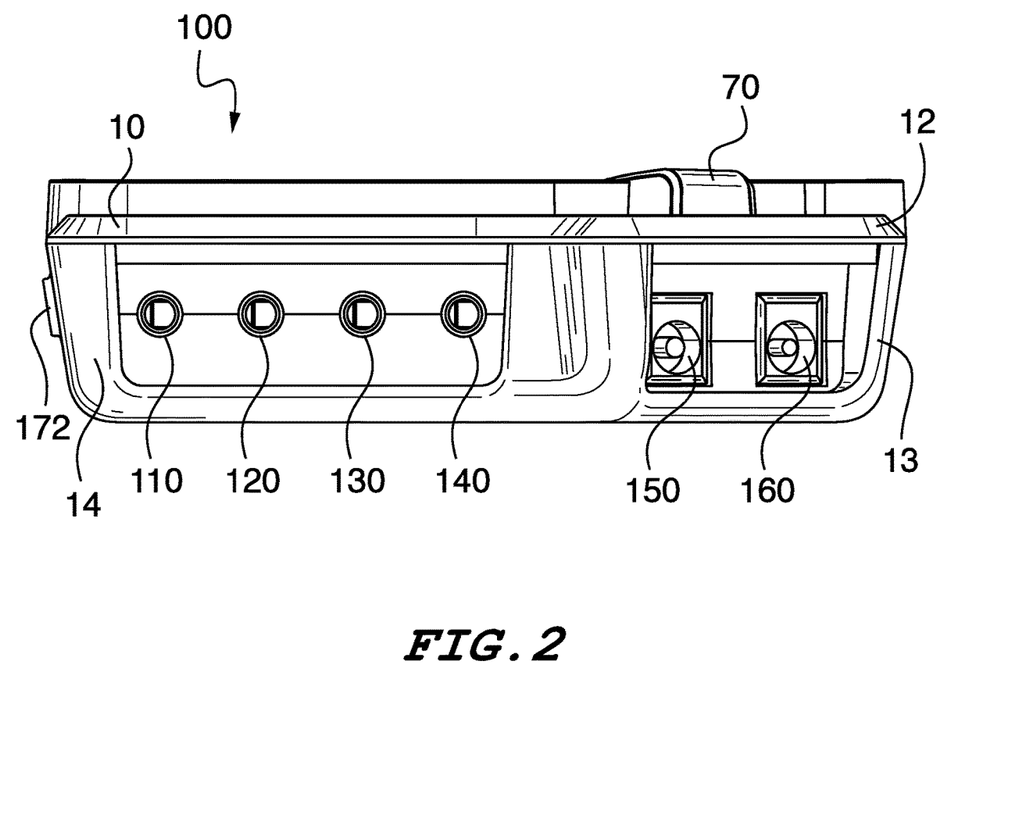
FIG. 2 is a bottom view of an indicator device in an embodiment of the invention.
Figure 6:
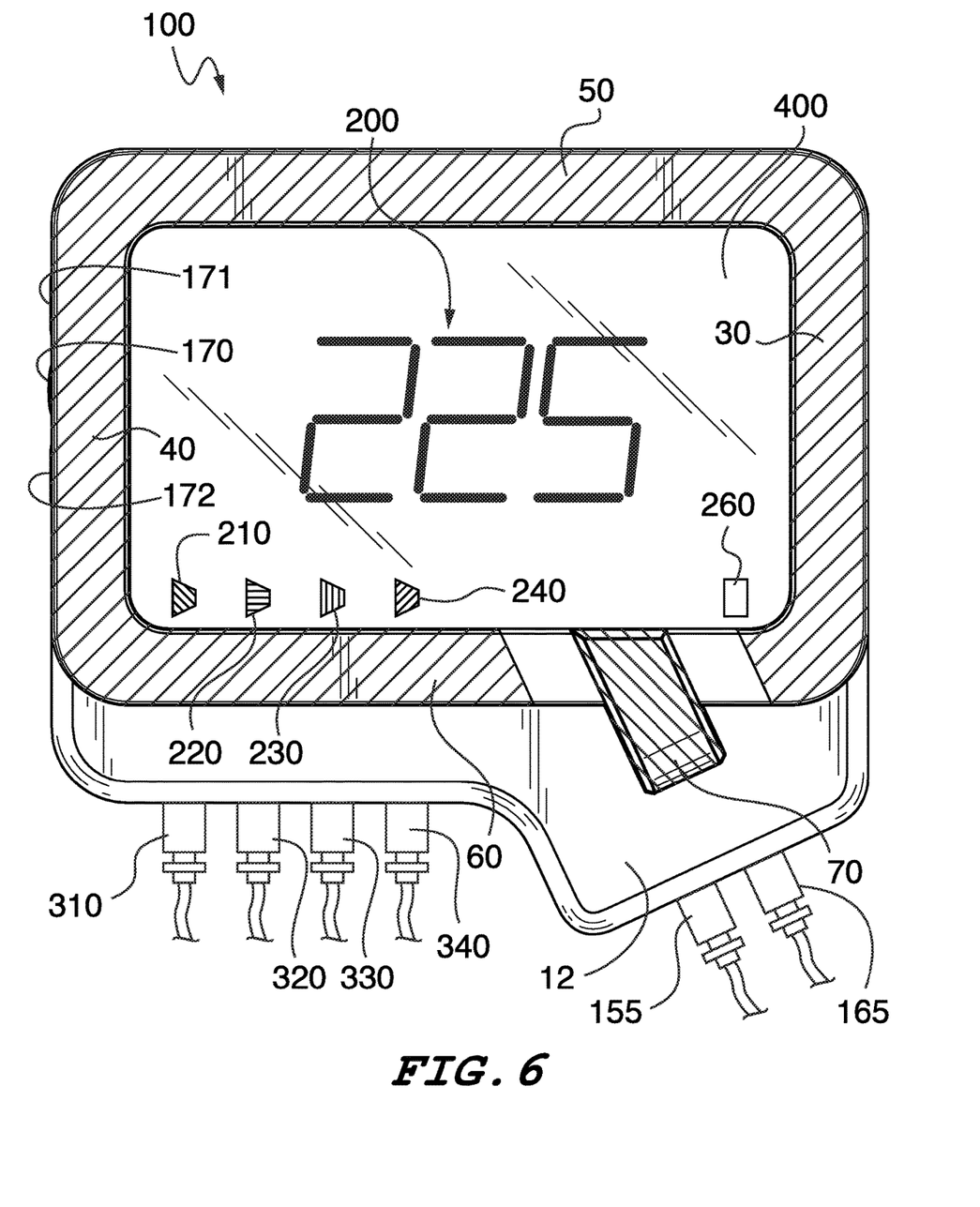
FIG. 6 is a front view of an indicator device in operation in an embodiment of the invention.

FIG. 2 presents a bottom view of an indicator device in an embodiment of the invention. First sensor port 110 is configured to receive an input. In an embodiment of the invention, the input can be a temperature probe. The indicator device 100 can comprise second sensor port 120, third sensor port 130, and fourth sensor port 140. As shown in FIG. 6, first sensor indicator 210 can be illuminated when a first sensor 310 is connected to the indicator device 100 via first sensor port 110. Second sensor indicator 220 can be illuminated when a second sensor 320 is connected to second sensor port 120. Third sensor indicator 230 can be illuminated when a third sensor 330 is connected to third sensor port 130. Fourth sensor indicator 240 can be illuminated when a fourth sensor 340 is connected to the fourth sensor port 140. The sensor ports can be positioned within a recess formed between housing front 10 and housing rear 14 each shown partially surrounding the probe ports. Additional sensors and corresponding sensor indicators can be employed as desired in the spirit of the invention.

Power input 160 can accept electricity to power the device. An AC adapter can be utilized to convert power to DC for use in the device as is known in the art. In an alternate embodiment, indicator device 100 can run on an alternate power supply, for example battery power. Power output 150 can be provided to power an accessory or feedback device. In one embodiment, power output 150 can be used to power a fan for use in a temperature controller. Power input 160 and power output 150 can be positioned within a recess formed by tail housing front 12 and tail housing rear 13.

FIG. 3 presents an exploded view of an indicator device in an embodiment of the invention. A number of structures and features combine to provide a primary indicator that presents a consistent visual signal to a user. The device can present a solid glow rather than point sources of light for a consistent illuminated surface. Herein, illuminating elements can be any light source, however light emitting diodes (LEDs) are energy efficient and small and suited for including in devices in the scope of the invention. LEDs can be attached to a printed circuit board, for example circuit board 350. Light reflector 410 can be joined to surround indicator 20 by welding or melt adhesive or other methods known in the art. Central housing 18 can comprise prongs to correspond with openings in surround indicator 20 and light reflector 410 that can be melted to fixedly attach central housing 18, surround indicator 20 and light reflector 410. In one method of construction a welded unitary piece can be connected to a housing rear 14 by a plurality of clips such as exemplary first side clip 401 and auxiliary first side clip 404. Central housing 18 can be configured to surround display 200. Surround indicator 20 can comprise structures surround extension 21 and tail extension 22 to establish stable construction of the device. Light reflector 410 can be configured to surround the display 200 and allow the display to be viewable through lens 400. For illustrative purposes, an exemplary readout of 275 is indicated on display 200. In a particular embodiment, display 200 can be rectangular, and light reflector 410 comprises an opening to at least partially surround display 200. Light reflector 410 can be formed from a reflective material such as stainless steel. Lens 400 can cover the opening in central housing 18 and can comprise a translucent lens made of plastic, for example polycarbonate thermoplastic. In one embodiment, matte clear Lexan can be employed with blackout windows centered over LEDS, e.g. first sensor LED 391, to provide visibility of the LEDs when illuminated, and provide a deadfront or blackout appearance when LEDs are not illuminated. Button pad 175 can comprise a flexible plastic or rubber and provide for transmission of button presses to circuit board 350 positioned within housing rear 14. Sensor indicator aperture 61 can be configured in a square, trapezoid, circle or other geometry. Additional indicator apertures can be configured in like manner and provided in various embodiments of the invention. Connection aperture 66 is disposed on central housing 18 to allow transmission of light from circuit board 350 through lens 400 to be viewable by a user. Label 407 can be applied to the exterior of housing rear 14 to convey information to a user, including e.g. regulatory compliance notices.

Figure 4:
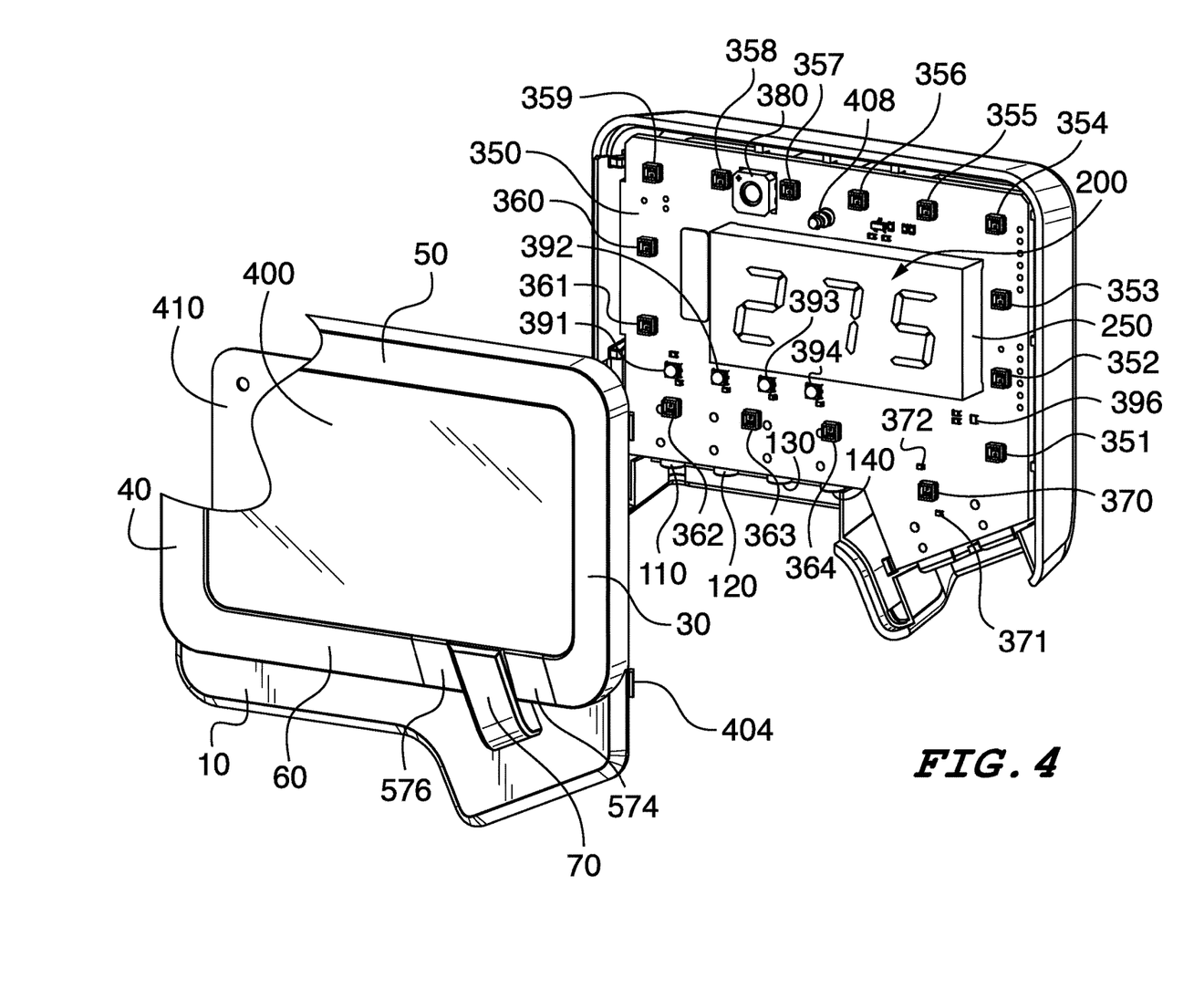
FIG. 4 is an exploded front view of an indicator device in an embodiment of the invention.

FIG. 4 presents a partially exploded front view of an indicator device in an embodiment of the invention. A partial cutaway shows lens 400 positioned over light reflector 410. It will be understood that multiple colors can be produced by utilizing multiple LEDs each providing a different color. In a more efficient embodiment, multicolor LEDs can be employed that each occupy less space, require fewer electrical connections, and provide multiple colors of illumination. A plurality of multicolor LEDs can be placed around the periphery to illuminate the surround indicator 20. For example, first surround LED 351 is shown in FIG. 4. Several additional LEDs can be utilized such as second surround LED 352, third surround LED 353, fourth surround LED 354, fifth surround LED 355, sixth surround LED 356, seventh surround LED 357, eighth surround LED 358, ninth surround LED 359, tenth surround LED 360, eleventh surround LED 361, twelfth surround LED 362, thirteenth surround LED 363, and fourteenth surround LED 364. Elements 351 through 364 can comprise "a plurality of surround LEDs." Additional surround LEDs as well as fewer surround LEDs, can be utilized to provide illuminating elements in one or more colors in the spirit of the invention. Connection status can be signaled by illumination of connection indicator LED 396. First sensor LED 391, second sensor LED 392, third sensor LED 393, and fourth sensor LED 394 can each comprise a particular color to correspond to a particular sensor and sensor indicator. For example, first sensor LED 391 can be a first color, and when first sensor 310 is inserted, first sensor LED 391 can be illuminated to provide first sensor indicator 210 viewable by a user in the same first color. In an embodiment this first indicator color can be red. In other embodiments, first indicator color can be any color, shade, or hue produced by a LED or light source. Tail indicator LED 370 can be illuminated in the same color as first indicator color, for example red, to indicate to a user that the display 200 is showing data from first sensor 310 or a first data category. Display control 250 provides the control circuitry for display 200. In an embodiment, first sensor 310 can be a temperature probe, and when the temperature probe is connected, first sensor indicator 210 can be illuminated in the first indicator color to communicate that the temperature probe is connected to first sensor port 110. The user can select to display information about the first sensor, and the tail indicator can be illuminated in a first tail color, e.g. red, to confirm that the display communicates information from a first data category or related to the information from the first sensor 310.

Second sensor LED 392 can be colored, for example a second indicator color, and when second sensor 320 is inserted, second sensor LED 391 can be illuminated to provide second sensor indicator 220 viewable by a user in a second indicator color in an embodiment of the invention. Selection of different colors can aid in clarity, and second indicator color can be yellow in an embodiment of the invention. Tail indicator 70 can be illuminated in a second tail color to indicate that the display 200 is displaying a second data category, e.g. information about second sensor 320. In an embodiment, second tail color can be the same as second indicator color, e.g. yellow. Third sensor LED 393 can be selected to display a third indicator color when illuminated, and when third sensor 330 is inserted in third sensor port 130, third sensor LED 393 can be switched on by the device to provide third sensor indicator 230 viewable by a user in the desired third indicator color. In an embodiment, third indicator color can be green. Other readily distinguished colors can be selected in various embodiments. Fourth sensor LED 394 can be selected to illuminate and provide a fourth indicator color, and the device can be programmed to illuminate fourth sensor LED 394 when fourth sensor 340 is inserted in fourth sensor port 140. Fourth sensor LED 394 can be selected to provide any color, and in an embodiment, fourth sensor LED 394 can provide a fourth indicator color as blue. Fourth sensor indicator 240 would be viewable by a user in fourth indicator color, for example blue. Tail indicator LED 370 can be selected to produce more than one color, for example red, green, and blue. Where additional colors are desired to match for example second sensor LED 392, additional LEDs can be employed in the region of tail indicator 70 to provide additional colors such as second tail indicator LED 371 and third tail indicator LED 372. Suitable LEDs for the tail indicator LED 370 can be selected from Cree, Inc. of Durham, N.C., for example the Cree PLCC6 three in one SMD LED model number CLX6F-FKC tricolor SMT LED, a multicolor LED that can produce red, green, and blue illumination. Connection indicator LED 396 can be selected to provide a common or distinct color of illumination, and in an embodiment can produce a white light. When the device is connected to a wireless device or network, connection indicator LED 396 can illuminate to produce connection indicator 260 viewable by a user. Suitable sources for connection indicator LED 396 include LiteOn Technology Corp Optoelectronics SMD LED e.g. LTST-C191KGKT is green and other colors can be selected at the web site www.LiteOn.com/opto and from the company located in New Taipei City, Taiwan.

Sound alarm 380 can be provided to produce an audible alert sound when certain conditions are met and may require user attention or user intervention. Sound alarm 380 can be a buzzer, for example a magnetic buzzer transducer available from CUI Inc. of Tualatin, Oreg., or other sound producing device. Fastener 408 can be utilized to secure housing front 10 to housing rear 14. Display control 250 can be a triple digit, seven segment LED Display, for example from Lumex of Palatine, Ill. and viewable at www.lumex.com. First tail spacer 574 is shown between tail indicator 70 and surround lens first side 30; it provides spacing and helps segregate the light from the surround indicator and the tail indicator. Second tail spacer 576 is shown between tail indicator 70 and surround lens bottom 60 and also helps segregate light sources and provide contrast to a user.

Figure 5:
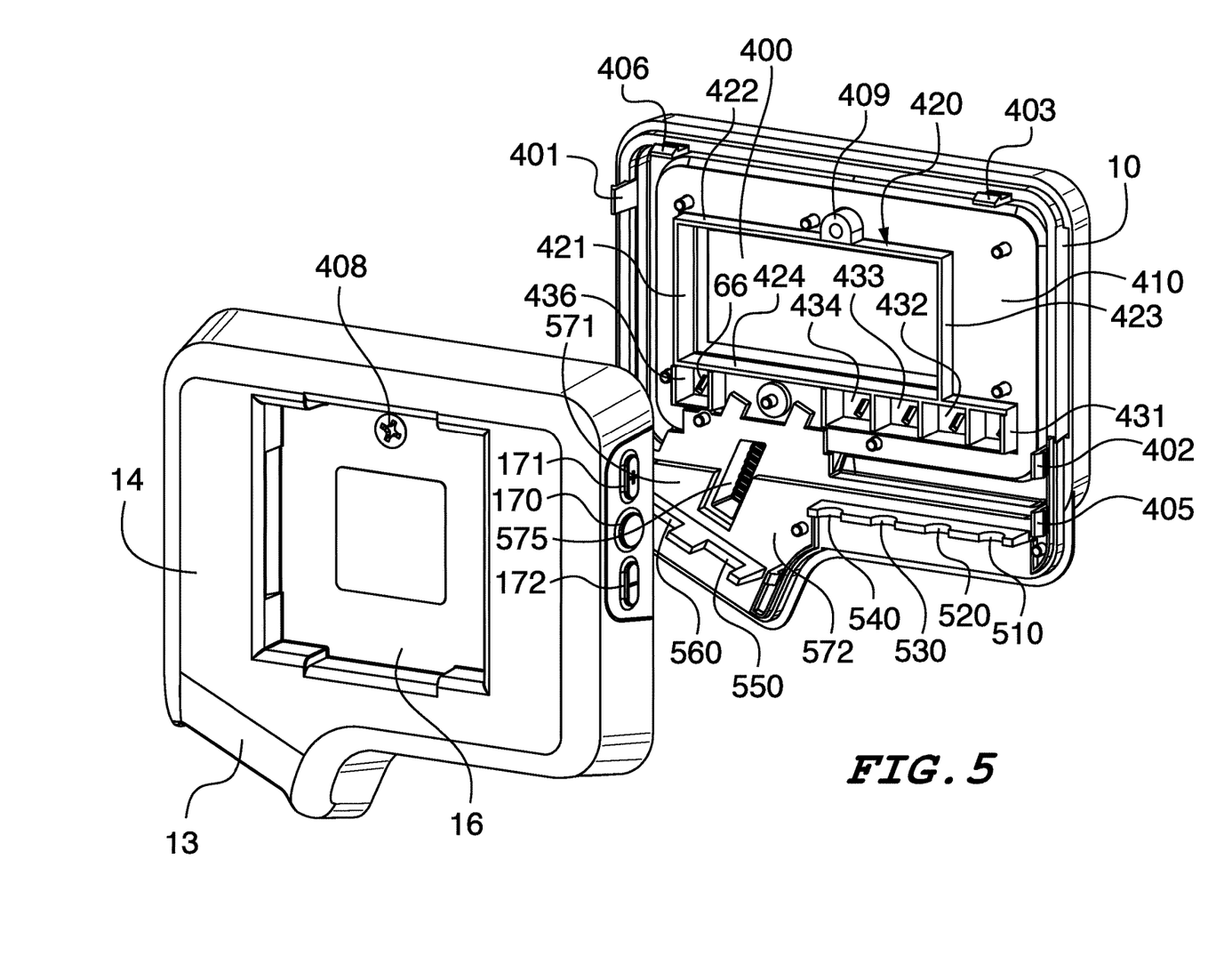
FIG. 5 is an exploded rear view of an indicator device in operation in an embodiment of the invention.

FIG. 5 presents an exploded rear view of an indicator device in an embodiment of the invention. Housing rear 14 is shown with stand recess 16 that can be utilized to connect the device to a stand (not shown) for stability. Tail housing rear 13 is shown at the bottom of the device. Housing front 10 can be connected to housing rear 14 with the use of clips and secured with fastener 408 that can be a threaded fastener suited for threaded attachment to fastener guide 409. Fastener 408 is shown accessible through the rear of the device. Exemplary clips include first side clip 401, second side clip 402, top clip 403, auxiliary second side clip 405, and auxiliary top clip 406, and can be selected and positioned to provide desired stability. Light reflector 410 is preferably positioned above the plurality of surround LEDs discussed above, elements numbered 351 through 364. Light reflector 410 can be positioned around a central opening and helps to reflect and diffuse the light from the surround LEDs so that they don't appear viewable as point sources of light through the surround indicator 20. The light from the surround LEDs can be made to bounce or reflect off the light reflector 410 to create a diffuse and consistent illumination that appears to be a glowing surround with an indicator color rather than discrete points of light. Display light shield 420 counteracts the light reflector 410 to prevent the light from blending into the other areas of the device.

Interior to housing front 10, a display light shield 420 can be disposed near the border of the light reflector to contain the light from the various light sources or LEDs. The display light shield 420 can be used to segregate the various sections of the invention. In an embodiment, display light shield 420 can be formed on an inside of central housing 18. A first section can be used to segregate the area of the display 200. The numerical display 200 can be walled off by a structure that is generally perpendicular to the lens 400 and meets with the circuit board 350. In this way, the light produced can not travel from one segmented compartment to another within the device, but can be viewable by a user through the lens 400. Display light shield 420 can be formed in any convenient shape, but in this embodiment is shown with generally rectangular shaped components. Surrounding the central portion of the lens are display light shield first side 421, display light shield second side 422, display light shield third side 423, and display light shield fourth side 424. In an alternate embodiment, the light shield can extend into the corners of the circuit board 350 and therefore segment portions of the surround indicator such as surround lens first side 30, surround lens second side 40, surround lens top 50, surround lens bottom 60, and LED control can be used to illuminate one or more portions of the surround indicator independently of the other portions.

Input buttons can provide for user input, and in an embodiment control button 170 can serve as an enter or selection button, first interface button 171 can serve as a plus or increase button, and second interface button 172 can server as a minus or decrease button. Other button functions can be utilized in various embodiments of the invention, connected to circuitry on circuit board 350. The circuitry on circuit board 350 can provide feedback control and manage a feedback device such as a fan as well as provide data to display 200 and control the various illuminating elements such as LEDs of the device of the invention.

First sensor light shield 431 can be apertured towards the front side of the controller to create a shaped lighted indicator. See indicator aperture 61 for example in FIG. 3, to form the border of first sensor indicator 210 in FIG. 5. The shape of the indicator can be a square, or rhombus, diamond, circle, or other desired outline to shape the light from a sensor LED into a shaped indicator on the front of the illuminated controller. It will be understood that LEDs can be combined with shaped apertures to communicate information to the user. A color LED can be positioned within a sensor light shield having a circular or O shaped aperture and a second LED can be positioned within a nearby light shield having a cross or X shaped aperture. The controller can communicate illuminated feedback by alternately lighting the LED in the desired light shield to show the user an X or O. In the embodiment shown in FIG. 4, first sensor light shield 431 is shown as an opaque structure configured to surround first sensor LED 391 and encapsulate the light from first sensor LED 391. The light shield structure prevents the light from an LED from blending into the other portions of the device. The walls of first sensor light shield 431 are shown in a square configuration but can be round or oval or other shape convenient for construction. The walls of the first sensor light shield 431 are sized to extend from light reflector 410 to circuit board 350. Second sensor light shield 432 can be configured to segregate second sensor LED 392, third sensor light shield 433 can be configured to segregate third sensor LED 393, and fourth sensor light shield 434 can be configured to segregate fourth sensor LED 394. Additional light shield structures can be provided in the spirit of the invention. Spaced apart from the sensor LEDs, connection light shield 436 is shown positioned to surround and segregate connection indicator LED 396. In the embodiment in the figures, the light shields are apertured at the front of the device to present a shaped indicator as shown in FIG. 5. As discussed, the aperture can be selected from known shapes to present a shaped indicator.

First sensor guide 510, second sensor guide 520, third sensor guide 530, and fourth sensor guide 540 are configured to guide the insertions of the corresponding sensors. Power output guide 550 and power input guide 560 can be configured to guide the insertion of power output 155 and power input 165 as well as support power output 150 and power input 160 against movement during repeated insertion or removal. Tail indicator channel 575 is configured to overlay the tail indicator LEDs, for example tail indicator LED 370, second tail indicator LED 371, and third tail indicator LED 372. The tail indicator channel 575 directs light from these LEDs to tail indicator 70 and prevents light blending into the rest of the indicator device. Tail light shield first side 571 and tail light shield second side 572 provide additional light shielding when configured to rest against circuit board 350.

In order to clearly communicate the status of a system at a distance, surround indicator 20 can be configured to change colors by way of illumination. Changing colors once and holding the color can indicate a status change. A change back and forth from dark to lit can produce a blinking effect to communicate a system status condition. A change back and forth from partially illuminated to fully illuminated, or dimly lit to brightly lit can produce a pulsing effect to communicate another system status. A dimly lit effect can be produced by cycling a portion of the LEDs off while a portion remain illuminated. A fast change back and forth from dark to illuminated can produce a fast blinking effect or a flashing effect to communicate a different system status condition. Rapid blinking or flashing can communicate an "alert" to a user. In an embodiment comprising a feedback controller for a cooker, pulsing can indicate the operation of a powered feedback input, e.g. fan operation. FIG. 6 shows the entire surround indicator as colored or illuminated in a first surround color shown in cross hatch. Where numerous colors are utilized, any color or shade can be selected as long as there is sufficient contrast with the other colors to clearly communicate a system status or status condition. The primary colors of red, yellow, and blue are suited for providing good contrast. Secondary colors green, orange, and purple also provide sufficient contrast. The specific colors used for each indication are not essential and the colors called out in the embodiments herein are for illustrative purposes only. Red and blue are interchangeable with a "first color" and a "second color." Blue corresponds to cool and can be used in a temperature controller embodiment to signify a status below temperature with a first surround color. Red can be associated with heat and can be used in a temperature controller embodiment to signify a status that is at temperature. A flashing red illumination can be used in a temperature controller embodiment to signify an alert or an over-temperature status. An over-temperature status can be defined by a user as greater than a set point temperature (e.g. >260 degrees F.) or a dependent value, for example an "alert temperature" defined as equal to a set point temperature plus 10 degrees F. An "at temperature" status can be defined as the set point temperature plus or minus 10 degrees F. Other ranges for at temperature or alert temperature can be defined for different situations or different measured variables. When powered on and connected to sensors as shown in FIG. 5, sensor indicators can be activated to show the connection. Colors are shown in cross hatch in the Figures. A dark control face is shown in FIG. 1.

FIG. 6 presents a front view of an illuminated indicator device in operation in an embodiment of the invention. Power input 165 and power output 155 are shown connected to indicator device 100. The controller can sense a first parameter through, for example first sensor 310. In a particular embodiment, first sensor 310 can determine a physical measurement, for example temperature. The illuminated indicator device can communicate that the physical measurement is below the desired range by illuminating the surround indicator 20 in a first surround color, for example blue. Where the physical measurement is within range, or at the desired temperature, the surround indicator 20 can be illuminated in a second surround color, for example red. Red can indicate a hot status. Where the physical measurement is over the target range, the surround indicator 20 can flash by activating Surround LEDs 351 through 364 rapidly on and off. Alternately, a measurement status above range can be communicated by illuminating the surround indicator 20 in a third surround color, e.g. yellow. The surround indicator 20 can also blink, flash, pulse, or change colors to indicate a system status. The surround LEDs 351 through 364 can also pulse or blink slowly. In an embodiment, a portion of the surround LEDs, for example half, can blink to provide a subtle pulsed illumination. A slow frequency pulse or subtle pulse with a slight change in illumination intensity can be used to communicate a system status that does not require user action. In contrast, a flashing effect in combination with an alert from sound alarm 380 can be used to communicate a system status that is urgent or that requires user action. Additionally, display 200 can combine with the surround indicator 20 to communicate specific text ("Err"), number, or character information. For example, in a temperature controller embodiment, a blinking surround indicator 20 can be used to draw the user's attention while a corrective action can be communicated in text by display 200. Conversion from numerical display to text display can also communicate an additional system status. In an embodiment, the system status can be defined as overtemperature when the measured pit temperature is ten degrees or more over the set temperature.

In operation of the device in a feedback temperature controller embodiment, first surround color can be provided in blue to indicate that the temperature is below the set point. With an exemplary set point of 250 degrees F., the display shows that the temperature provided by first sensor 310 is below the target temperature. Tail indicator 70 is illuminated in first tail color, e.g. red, corresponding to first indicator color, e.g. red, of first sensor indicator to communicate that the display 200 is providing information from the first sensor 310, in this example first tail color communicates that a first data category is being presented by the display, e.g. a pit temperature. The pit temperature is shown on the display as 225 corresponding to degrees F. In other embodiments, other units and measurements can be utilized. The indicator device shows, through color, that the display is related to the first sensor 310 by illuminating tail indicator 70 in first tail color, e.g. red. Information from the data category of actual measured temperature is displayed, and the surround indicator 20 is illuminated in blue to show a first system status, here, that the pit temperature is below the target temperature. The tail indicator communicates a data category viewable at a distance, the display communicates a data point, and the surround indicator communicates a system status viewable at distance. Thus a user can be informed about a data category and a system status relative to that data category both at a glance, and at a distance where text is not easily perceived or discerned. The system can be configured to communicate a second data category, third data category, a fourth data category etc. as coded in shorthand by a tail indicator color that may also correspond to an indicator color. The surround indicator 20 may be configured in a different shape or style as needed in a particular embodiment and may be considered a primary indicator. The tail indicator 70 may also be configured in a different shape or style and may be considered a secondary indicator. Light reflector 410 and display light shield 420 can be configured to segregate the illumination of the primary indicator and secondary indicator.

Figure 7:
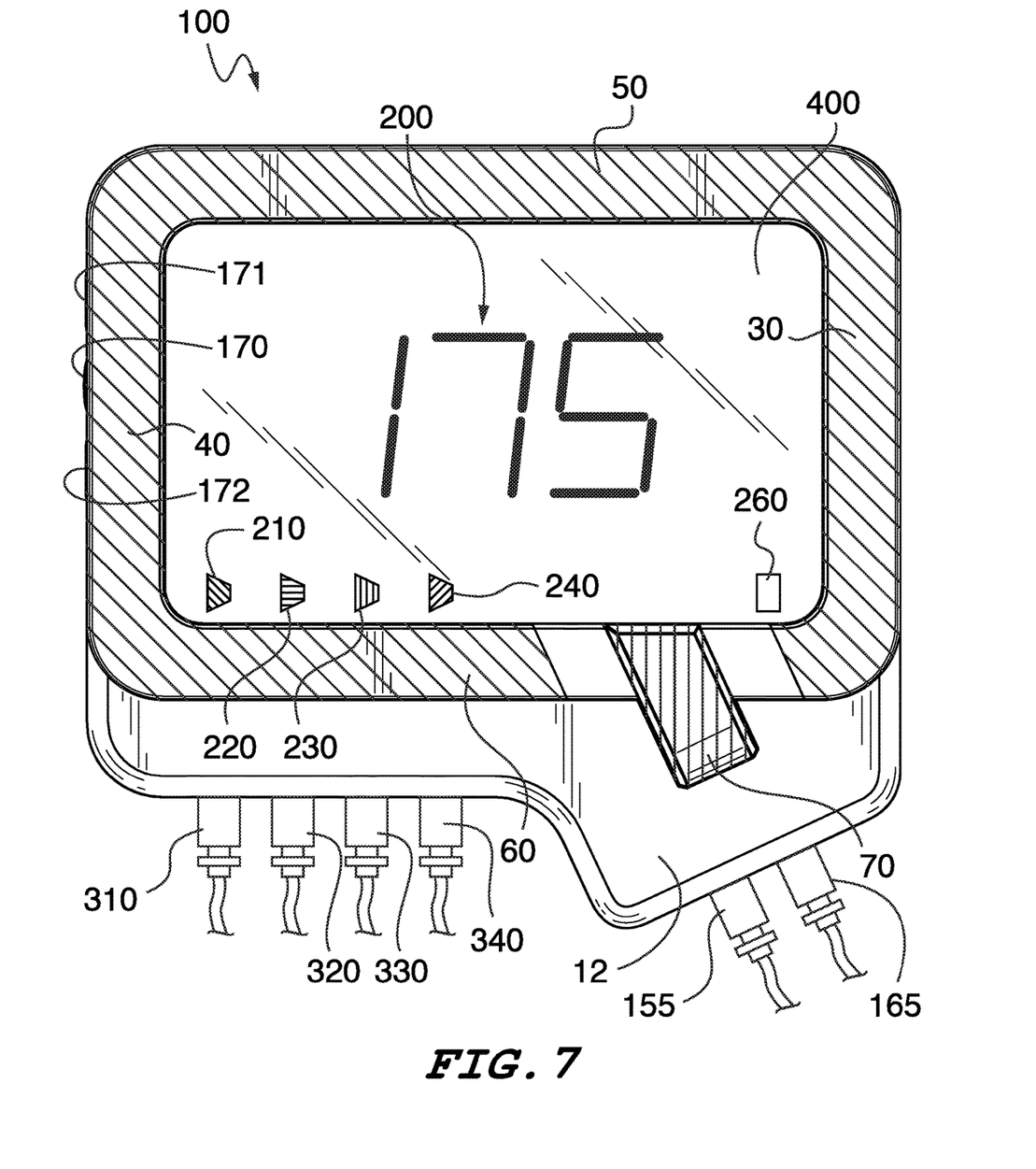
FIG. 7 is a front view of an indicator device in operation in an embodiment of the invention.

FIG. 7 presents a front view of an illuminated controller in operation in an embodiment of the invention. In this example, tail indicator 70 is presented in a third tail color, e.g. green, corresponding to third indicator color, e.g. green, of third sensor indicator 230. Third sensor 330 can be a temperature probe that is inserted into a food item. When the tail indicator 70 is illuminated matching third sensor indicator 230, the user is informed that the display 200 is showing a third data category, information about the third sensor 330, or in this example, the temperature of a food item. Second sensor 320 can be inserted into first food item and third sensor 330 can be inserted into a second food item. The temperature of the food item is displayed as 175 indicating degrees F. Various combinations of colors can be utilized to communicate different system statuses.

Secondary indicator of the invention in this embodiment is provided by tail indicator 70. In other embodiments, different shapes or configurations can be used. Tail indicator 70 can be positioned inside or outside surround indicator 20. The tail indicator 20 communicates to a user that a data category is being displayed on display 200. When the tail indicator 70 displays a first tail color, a user is informed that the display corresponds to a first data category. For example, a cooking temperature or pit temperature. When the tail indicator 70 displays a second tail color, the device communicates to a user that the display corresponds to a second data category, for example a temperature of a first food item. When the tail indicator 70 displays a third tail color, the invention communicates to a user that a third data category is being described. In an embodiment the third data category can be a temperature of a second food item, and the data can be provided by third sensor 330. A fourth tail color can correspond to a fourth data category provided by a fourth sensor 340, and it will be understood that additional colors can communicate additional categories of data.

In FIG. 7, the embodiment of the invention provides the primary indicator as surround indicator 20 and is illuminated in a second surround color, e.g. red. The color of the primary indicator can communicate a system status to a user visible at a distance without the need to perceive or read a number or text or symbols. The color can let a user know the system status at a glance. In the cooker temperature controller embodiment, a first indicator color can indicate a first system status condition. For example, if the primary indicator, surround indicator 20, is illuminated in a first indicator color of blue, this can communicate that the system, the cooker, is below the target temperature. The surround indicator 20 can be illuminated in a second indicator color, for example red, to communicate that the system is hot, or at the target temperature. The surround indicator can be made to blink rapidly to show that the cooker temperature system status is too hot or over-temperature status condition. Additionally, a subset of the plurality of surround LEDs can be made to blink slowly so that the surround indicator pulses to indicate another system status, for example that the power output port 150 has been activated to control a feedback element, for example a fan in a temperature control feedback system. The primary indicator can communicate a system status, and the secondary indicator can communicate a data category, and the display can communicate data. In this way, the visual indication system for a feedback controller can communicate a wide range of system status and system data to a user simultaneously at a glance and at a distance. In various embodiments, it will be understood that the configuration of the indicators can be rearranged or switched. The secondary indicator or tail indicator can be utilized to communicate system status and the primary indicator can be used to communicate a data category selected by the device.

Any description of a component or embodiment herein also includes hardware, software, and configurations which already exist in the prior art and may be necessary to the operation of such component(s) or embodiment(s). Further, the operations described herein can be performed in any sensible order. Any operations not required for proper operation can be optional. Further, all methods described herein can also be stored on a computer readable storage to control an indicator device.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A visual indicator device for controlling a cooking system comprising:
    a primary indicator comprising a surround lens at least partially surrounding a display;
        a secondary indicator comprising a translucent tail adjacent said display;
    at least one illuminating element disposed interior said translucent tail;
        a plurality of illuminating elements disposed interior said primary indicator;
        a light reflector disposed between said plurality of illuminating elements and said surround lens;
        a housing retaining said primary indicator and said secondary indicator and containing a circuit board for controlling said display, said plurality of illuminating elements, and said at least one illuminating element; and
        said plurality of illuminating elements and said at least one illuminated element are configured to indicate status of said cooking system.

2. The visual indicator device of claim 1 wherein said plurality of illuminating elements comprises LEDs configured to produce a first indicator color and a second indicator color.

3. The visual indicator device of claim 1 wherein said plurality of illuminating elements comprises LEDs in a first color to produce a first indicator color and LEDs in a second color to produce a second indicator color.

4. The visual indicator device of claim 2 wherein said at least one illuminating element comprises at least one multicolor LED configured to produce a first tail color and a second tail color.

5. The visual indicator device of claim 4 further comprising:
a central lens disposed central to said surround lens;
a display light shield positioned between said circuit board and said central lens and oriented substantially perpendicular to said central lens, and surrounding said display wherein said display light shield prevents light from said plurality of illuminating elements from reaching the portion of said central lens above said display.

6. The visual indicator device of claim 5 wherein said light reflector abuts at least a display light shield first side, a display light shield second side, and a display light shield third side.

7. The visual indicator device of claim 6 further comprising a first sensor LED disposed within a first sensor light shield, and a second sensor LED disposed within a second sensor light shield.

8. The visual indicator device of claim 7 wherein said display light shield is attached to a central housing comprising a sensor indicator aperture positioned above said first sensor LED to provide a first sensor indicator viewable by a user.

9. A communication device for informing a user comprising:
a housing having a surround indicator comprising a translucent surround lens and a tail indicator comprising a translucent tail lens;
wherein said surround indicator occupies a significant portion of a circumference of said housing;
a display positioned central to said surround indicator; and
said tail indicator having an orientation radial to the path of said surround indicator, and said tail indicator positioned to interrupt said surround indicator.

10. The device of claim 9 wherein said surround indicator is illuminated by a plurality of illuminating elements to indicate a status condition.

11. The device of claim 9 wherein said surround indicator is illuminated in a first surround color to indicate a first status and said tail indicator is simultaneously illuminated in a first tail color to indicate a data category is presented on said display.

12. The device of claim 9 wherein said surround indicator is illuminated in a first surround color to indicate a first status condition and alternately illuminated in a second surround color to indicate a second status condition.

13. The device of claim 9 wherein said surround indicator comprises a first surround section and a second surround section and said first surround section changes color independent of said second surround section to indicate a status condition.

14. The device of claim 9 wherein said surround indicator changes colors repeatedly to indicate a status condition.

15. A visual indicator device for a feedback controller for a cooking system comprising:
a display, a first sensor indicator, a second sensor indicator, a power output port, and a plurality of multicolor LEDs disposed on a circuit board;
said plurality of multicolor LEDs positioned exterior to a display light shield and interior to a surround indicator;
a tail indicator illuminated by at least one LED; and
wherein said surround indicator is illuminated in a first surround color to communicate a first status of said cooking system and illuminated in a second surround color to communicate a second status of said cooking system.

16. The device of claim 15 wherein said tail indicator illuminated by at least one LED further comprises a multicolor LED disposed within a tail light shield.

17. The device of claim 16 wherein:
said tail indicator is illuminated in a first tail color corresponding to a first indicator color provided by said first sensor indicator to communicate a first data category is presented by said display; and
said tail indicator is illuminated in a second tail color corresponding to a second indicator color provided by said second sensor indicator to communicate a second data category is presented by said display.

18. The device of claim 17 further comprising:
a third sensor indicator and a fourth sensor indicator wherein said tail indicator is illuminated in a third tail color to communicate a third data category is presented by said display; and
said tail indicator is illuminated in a fourth tail color to communicate a fourth data category is presented by said display.

19. The device of claim 15 wherein said feedback controller further comprises a temperature probe, and illuminates said surround indicator in said first surround color when said temperature probe registers a temperature below a set point temperature.

20. The device of claim 19 wherein said surround indicator is illuminated in said second surround color when said temperature probe registers a temperature above said set point temperature.

21. The device of claim 15 wherein said surround color is alternately illuminated to appear blinking when said temperature probe registers a temperature above an alert temperature.

* * * * *